United States Patent
Kim et al.

(10) Patent No.: US 6,787,287 B2
(45) Date of Patent: Sep. 7, 2004

(54) PHOTOSENSITIVE POLYMERS AND RESIST COMPOSITIONS COMPRISING THE PHOTOSENSITIVE POLYMERS

(75) Inventors: Hyun-woo Kim, Suwon (KR); Sang-gyun Woo, Suwon (KR); Yool Kang, Sungnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 10/103,756

(22) Filed: Mar. 25, 2002

(65) Prior Publication Data

US 2002/0146642 A1 Oct. 10, 2002

(30) Foreign Application Priority Data

Apr. 4, 2001 (KR) .......................................... 2001-17948

(51) Int. Cl.$^7$ .............................................. G03F 7/075
(52) U.S. Cl. .................... 430/270.1; 430/905; 430/914; 526/266
(58) Field of Search ............................ 430/270.1, 925, 430/914, 921, 945; 526/266

(56) References Cited

U.S. PATENT DOCUMENTS

| | | | |
|---|---|---|---|
| 3,784,594 A | * | 1/1974 | Papa et al. .................. 521/182 |
| 5,189,184 A | * | 2/1993 | Schaefer et al. ............ 549/427 |
| 5,496,930 A | * | 3/1996 | Holla et al. ................ 536/1.11 |
| 5,882,835 A | * | 3/1999 | Park et al. .................. 430/170 |
| 6,517,990 B1 | * | 2/2003 | Choi et al. ............... 430/270.1 |
| 2002/0072009 A1 | * | 6/2002 | Kim et al. ............... 430/270.1 |
| 2002/0160303 A1 | * | 10/2002 | Kim et al. ............... 430/270.1 |

FOREIGN PATENT DOCUMENTS

GB    1150348 A  *  4/1969  ........... C08G/53/08

OTHER PUBLICATIONS

Aldrich Handbook of Fine Chemicals and Laboratory Equipment 2000–2001; (http://www.sigmaaldrich.com) pp. 19 and 500–501.*

* cited by examiner

*Primary Examiner*—Yvette C. Thornton
(74) *Attorney, Agent, or Firm*—Volentine Francos, PLLC

(57) ABSTRACT

A photosensitive polymer of a resist composition includes a copolymer of alkyl vinyl ether containing silicon and maleic anhydride, represented by the following formula:

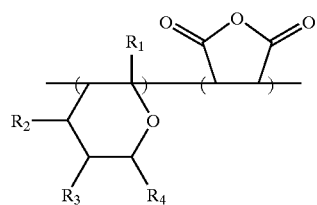

where $R_1$ is —H, —OSi(CH$_3$)$_2$C(CH$_3$)$_3$ or —OSi(CH$_3$)$_3$; $R_2$ is —H, —OH, —OCOCH$_3$, —OSi(CH$_3$)$_2$C(CH$_3$)$_3$ or —OSi(CH(CH$_3$)$_2$)$_3$; $R_3$ is —H, —OH or —OCOCH$_3$; $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$; and at least one of $R_1$, $R_2$, $R_3$ and $R_4$ is a Si-containing group.

21 Claims, No Drawings

PHOTOSENSITIVE POLYMERS AND RESIST COMPOSITIONS COMPRISING THE PHOTOSENSITIVE POLYMERS

BACKGROUND OF THE INVENTION

1. Field of the Invention

The present invention generally relates to chemically amplified resist compositions, and more particularly, to photosensitive polymers containing silicon and to resist compositions containing such polymers.

2. Description of the Related Art

As the integration density and complexity of semiconductor devices continue to increase, the ability to form ultra-fine patterns becomes more and more critical. For example, in 1-Gigabit or higher semiconductor devices, a pattern size having a design rule of 0.2 µm or less is needed. For this reason, in lithography processes, lower wavelength devices such as the ArF eximer laser (193 nm) have emerged as exposure light sources which are preferred over the more conventional and higher wavelength KrF eximer laser (248 nm).

However, compared with conventional (KrF) resist materials, resist materials which are suitable for use with the ArF eximer laser suffer from a variety drawbacks. One significant problem relates to the increased occurrence of collapsed patterns as the aspect ratio of pattern features is increased. As a result, patterns must generally be formed using resist layers of 4000 Å or less in thickness. Other problems result from the inferior transmittance of conventional ArF resists relative to that of KrF resists. For example, the low transmittance is another limiting factor on the thickness of the ArF resist layer.

In addition, the resistance to dry etching of almost all well-known ArF resists is at best on par with, an in most cases inferior to, that of KrF resists. This makes it difficult to achieve a satisfactory profile when patterning an underlying layer is by lithography.

In an effort to overcome these problems with convention ArF resists, a bi-layer resist (BLR) technique has been suggested in which lithography is performed using a resist material containing silicon. Using this technique, silicon atoms within the resist material are glassed in the form of $SiO_x$ during dry etching by $O_2$ plasma to form a curing layer, and the curing layer is used as an etching mask during subsequent dry etching. In this manner, the resistance to dry etching is increased. Therefore, in the case where the aspect ratio is large, the collapse of patterns is avoided and the formation of patterns is facilitated. As a result, patterns having large aspect ratios can be formed using high resolution power.

The amount of silicon contained in a polymer of the resist material is an important factor in establishing the characteristics of the BLR process. Generally, as the amount of silicon increases, thermal stability of the resist layer decreases and wettability with respect to a developing solution is reduced. Therefore, silicon must be contained with an amount suitable for a BLR process, and there is a demand for the development of a such resist material exhibiting favorable thermal stability and wettability characteristics.

SUMMARY OF THE INVENTION

It is an objective of present invention to provide a photosensitive polymer which has sufficient silicon content and which exhibits favorable lithography characteristics when used as a resist material.

It is also an objective of the present invention to provide a resist composition which has a silicon content that is sufficient for use as the BLR of ArF eximer laser lithography, and which exhibits favorable thermal stability and wettability characteristics.

According to one aspect of the present invention, there is provided a photosensitive polymer comprising a polymer of alkyl vinyl ether, represented by the following formula:

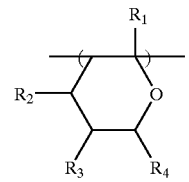

where
$R_1$ is —H, —$OSi(CH_3)_2C(CH_3)_3$ or —$OSi(CH_3)_3$,
$R_2$ is —H, —OH, —$OCOCH_3$, —$OSi(CH_3)_2C(CH_3)_3$ or —$OSi(CH(CH_3)_2)_3$,
$R_3$ is —H, —OH or —$OCOCH_3$,
$R_4$ is —H, —$OSi(CH_3)_2C(CH_3)_3$, —$CH_2OSi(CH_3)_2C(CH_3)_3$ or —$CH_2OSi(CH(CH_3)_2)_3$ and
at least one of $R_1$, $R_2$ and $R_4$ is a Si-containing group.

In another aspect of the present invention, there is provided a photosensitive polymer comprising a copolymer of alkyl vinyl ether and maleic anhydride, represented by the following formula:

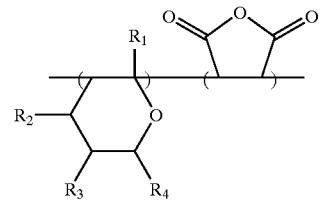

where
$R_1$ is —H, —$OSi(CH_3)_2C(CH_3)_3$ or —$OSi(CH_3)_3$,
$R_2$ is —H, —OH, —$OCOCH_3$, —$OSi(CH_3)_2C(CH_3)_3$ or —$OSi(CH(CH_3)_2)_3$,
$R_3$ is —H, —OH or —$OCOCH_3$,
$R_4$ is —H, —$OSi(CH_3)_2C(CH_3)_3$, —$CH_2OSi(CH_3)_2C(CH_3)_3$ or —$CH_2OSi(CH(CH_3)_2)_3$, and
at least one of $R_1$, $R_2$ and $R_4$ is a Si-containing group.

According to still another aspect of the present invention, there is provided a resist composition comprising a photosensitive polymer and a photoacid generator (PAG), wherein the photosensitive polymer comprises a polymer of alkyl vinyl ether, represented by the following formula:

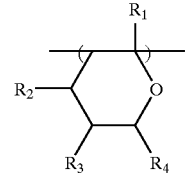

where $R_1$ is —H, —OSi(CH$_3$)$_2$C(CH$_3$)$_3$ or —OSi(CH$_3$)$_3$, $R_2$ is —H, —OH, —OCOCH$_3$, —OSi(CH$_3$)$_2$C(CH$_3$)$_3$ or —OSi(CH(CH$_3$)$_2$)$_3$, $R_3$ is —H, —OH or —OCOCH$_3$, $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and at least one of $R_1$, $R_2$ and $R_4$ is a Si-containing group.

According to still another aspect of the present invention, there is provided a resist composition comprising a photosensitive polymer and a photoacid generator (PAG), wherein the photosensitive polymer comprises a copolymer of alkyl vinyl ether and maleic anhydride, represented by the following formula:

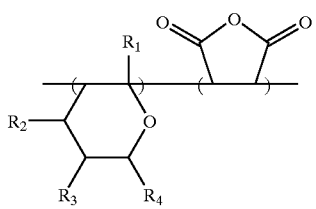

where $R_1$ is —H, —OSi(CH$_3$)$_2$C(CH$_3$)$_3$ or —OSi(CH$_3$)$_3$, $R_2$ is —H, —OH, —OCOCH$_3$, —OSi(CH$_3$)$_2$C(CH$_3$)$_3$ or —OSi(CH(CH$_3$)$_2$)$_3$, $R_3$ is —H, —OH or —OCOCH$_3$, $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and at least one of $R_1$, $R_2$ and $R_4$ is a Si-containing group.

DETAILED DESCRIPTION OF THE PREFERRED EMBODIMENTS

The resist compositions containing the photosensitive polymers of the invention exhibits good adhesiveness to underlying layers, as well as enhanced selectivity relative to conventional materials. Also, the resist compositions can provide sufficient resistance to dry etching, and can secure favorable thermal stability and wettability characteristics. Described below are a number of embodiments of the present invention, followed by a number of non-limiting examples thereof.

According to a first embodiment of the present invention, a photosensitive polymer includes a polymer of alkyl vinyl ether, represented by the following formula:

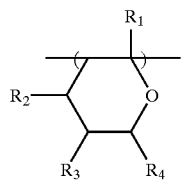

where $R_1$ is —H, —OSi(CH$_3$)$_2$C(CH$_3$)$_3$ or —OSi(CH$_3$)$_3$, $R_2$ is —H, —OH, —OCOCH$_3$, —OSi(CH$_3$)$_2$C(CH$_3$)$_3$ or —OSi(CH(CH$_3$)$_2$)$_3$, $R_3$ is —H, —OH or —OCOCH$_3$, $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and at least one of $R_1$, $R_2$ and $R_4$ is a Si-containing group.

According to a second embodiment of the present invention, a photosensitive polymer includes a copolymer of alkyl vinyl ether and maleic anhydride, represented by the following formula:

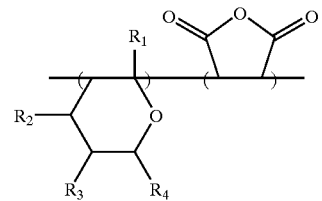

where $R_1$ is —H, —OSi(CH$_3$)$_2$C(CH$_3$)$_3$ or —OSi(CH$_3$)$_3$, $R_2$ is —H, —OH, —OCOCH$_3$, —OSi(CH$_3$)$_2$C(CH$_3$)$_3$ or —OSi(CH(CH$_3$)$_2$)$_3$, $R_3$ is —H, —OH or —OCOCH$_3$, $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$, and at least one of $R_1$, $R_2$ and $R_4$ is a Si-containing group.

According to a third embodiment of the present invention, a resist composition includes a photosensitive polymer and a photoacid generator (PAG), wherein the photosensitive polymer comprises a polymer of alkyl vinyl ether, represented by the following formula:

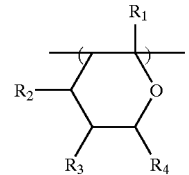

where $R_1$ is —H, —OSi(CH$_3$)$_2$C(CH$_3$)$_3$ or —OSi(CH$_3$)$_3$, $R_2$ is —H, —OH, —OCOCH$_3$, —OSi(CH$_3$)$_2$C(CH$_3$)$_3$ or —OSi(CH(CH$_3$)$_2$)$_3$, $R_3$ is —H, —OH or —OCOCH$_3$, $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and at least one of $R_1$, $R_2$ and $R_4$ is a Si-containing group.

According to a fourth embodiment of the present invention, a resist composition includes a photosensitive polymer and a photoacid generator (PAG), wherein the photosensitive polymer comprises a copolymer of alkyl vinyl ether and maleic anhydride, represented by the following formula:

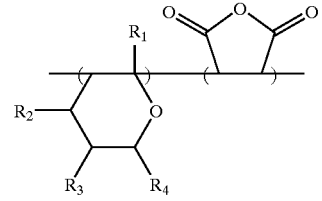

where $R_1$ is —H, —OSi(CH$_3$)$_2$C(CH$_3$)$_3$ or —OSi(CH$_3$)$_3$, $R_2$ is —H, —OH, —OCOCH$_3$, —OSi(CH$_3$)$_2$C(CH$_3$)$_3$ or —OSi(CH(CH$_3$)$_2$)$_3$, $R_3$ is —H, —OH or —OCOCH$_3$,
$R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and
at least one of $R_1$, $R_2$ and $R_4$ is a Si-containing group.

The weight average molecular weight of the photosensitive polymer is preferably in the range of 1,000 to 100,000.

In the case of the resist compositions, an amount of the PAG is preferably 1~30 wt % on the basis of the weight of the photosensitive polymer.

Preferably, the PAG comprises triarylsulfonium salts, diaryliodonium salts, sulfonates, or mixtures thereof. More preferably, the PAG comprises triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium PFOS (perfluorooctanesulfonate), diphenyliodonium PFOS, methoxydiphenyliodonium PFOS, di-t-butyldiphenyliodonium triflate, N-hydroxysuccinimide PFOS, norbornene-dicarboximide PFOS, or mixtures thereof.

The resist compositions may further comprise an organic base in an amount which is preferably 0.01~2.0 wt % on the basis of the weight of the photosensitive polymer. The organic base preferably comprises a tertiary amine compound alone or a mixture of at least two tertiary amine compounds. More preferably, the organic base comprises triethylamine, triisobutylamine, triiooctylamine, triisodecylamine, diethanolamine, triethanolamine, N-alkyl substituted pyrrolidinone, N-alkyl substituted caprolactam, N-alkyl substituted valerolactam, or a mixture thereof.

Also, the resist composition may further comprise a surfactant preferably in an amount of 30 to 200 ppm.

EXAMPLE 1

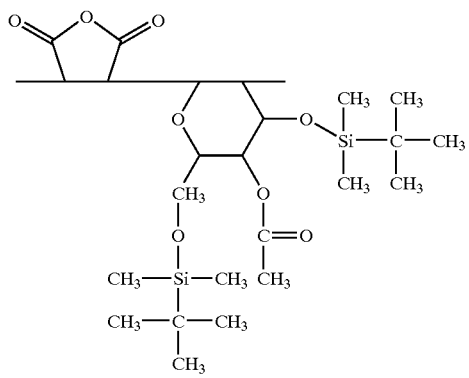

Synthesis of copolymer 9.8 g maleic anhydride (0.1 mol) and 41.7 g (4-O-acetyl-3,6-di-O-(t-butyldimethylsilyl)-D-glucal (0.1 mol) are dissolved in tetrahydrofuran (THF), benzene, dioxane, or ethyl acetate of 0.1~3 times on the basis of the weight of the whole monomers. Next, a polymerization initiator, 2,2'-azobisisobutyronitrile(AIBN) or dimethyl-2,2'-azobisisobutyrate (V601) of 0.1~20 mol % on the basis of the number of moles of the whole monomers is added to the solution. Dissolved oxygen is extracted from the obtained solution by degassing, and purged using nitrogen. The obtained solution is polymerized at 50~90° C. for 2~48 hours, diluted with THF, and precipitated with excess isopropyl alcohol, ether, hexane, or a mixture thereof. The precipitate is dissolved in THF again, and precipitated with isopropyl alcohol, ether, hexane, or a mixture thereof twice. The obtained precipitate is filtered, and dried in a vacuum oven at 50° C. for 24 hours. The ratio of the respective monomer units in the copolymer of the above structure can be controlled by controlling an initial feed ratio of two monomers used as synthesis materials.

As a result of synthesizing the copolymer of the above structure by the described method, an 80% yield was obtained.

EXAMPLE 2

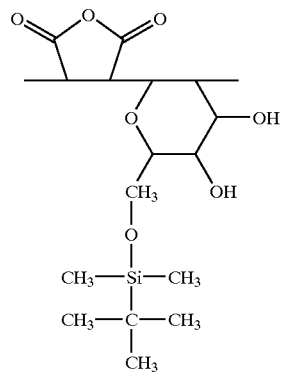

Synthesis of copolymer 9.8 g maleic anhydride (0.1 mol) and 26.0 g 6-O-(t-butyldimethylsilyl)-D-glucal (0.1 mol) are dissolved in THF, benzene, dioxane, or ethyl acetate of 0.1~3 times on the basis of the weight of the whole monomers. Next, a polymerization initiator, AIBN or V601 of 0.1~20 mol % on the basis of the number of moles of the whole monomers is added to the solution. Dissolved oxygen is extracted from the obtained solution by degassing, and purged using nitrogen. The obtained solution is polymerized at 50~90° C. for 2~48 hours, diluted with THF, and precipitated with excess isopropyl alcohol, ether, hexane, or a mixture thereof. The precipitate is dissolved in THF again, and precipitated with isopropyl alcohol, ether, hexane, or a mixture thereof twice. The obtained precipitate is filtered, and dried in a vacuum oven at 50° C. for 24 hours. The ratio of the respective monomer units in the copolymer of the above structure can be controlled by controlling an initial feed ratio of two monomers used as synthesis materials.

As a result of synthesizing the copolymer of the above structure by the described method, an 87% yield was obtained.

EXAMPLE 3

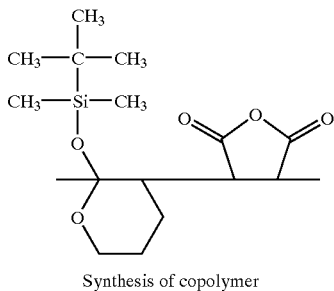

Synthesis of copolymer 9.8 g maleic anhydride (0.1 mol) and 21.4 g 6-(t-butyldimethylsilyloxy)-3,4-dihydro-2H-pyran (0.1 mol) are dissolved in THF, benzene, dioxane, or ethyl acetate of 0.1~3 times on the basis of the weight of the whole monomers. Next, a polymerization initiator, AIBN or V601 of 0.1~20 mol % on the basis of the number of moles of the whole monomers is added to the solution. Dissolved oxygen is extracted from the obtained solution by degassing, and purged using nitrogen. The obtained solution is polymerized at 50~90° C. for 2~48 hours, diluted with THF, and precipitated with excess isopropyl alcohol, ether, hexane, or a mixture thereof. The precipitate is dissolved in THF again, and precipitated with isopropyl alcohol, ether, hexane, or a mixture thereof twice. The obtained precipitate is filtered, and dried in a vacuum oven at 50° C. for 24 hours. The ratio of the respective monomer units in the copolymer of the above structure can be controlled by controlling an initial feed ratio of two monomers used as synthesis materials.

As a result of synthesizing the copolymer of the above structure by the described method, an 85% yield was obtained.

EXAMPLE 4

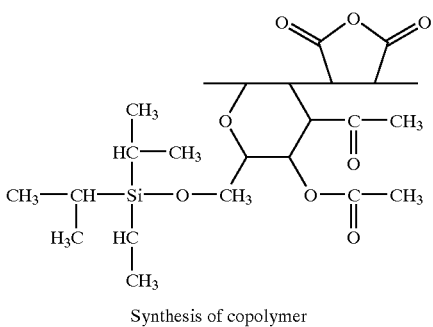

Synthesis of copolymer 9.8 g maleic anhydride (0.1 mol) and 38.7 g 3,4-di-O-acetyl-6-O-(trisisopropylsilyl)-D-galactal (0.1 mol) are dissolved in THF, benzene, dioxane, or ethyl acetate of 0.1~3 times on the basis of the weight of the whole monomers. Next, a polymerization initiator, AIBN or V601 of 0.1~20 mol % on the basis of the number of moles of the whole monomers is added to the solution. Dissolved oxygen is extracted from the obtained solution by degassing, and purged using nitrogen. The obtained solution is polymerized at 50~90° C. for 2~48 hours, diluted with THF, and precipitated with excess isopropyl alcohol, ether, hexane, or a mixture thereof. The precipitate is dissolved in THF again, and precipitated with isopropyl alcohol, ether, hexane, or a mixture thereof twice. The obtained precipitate is filtered, and dried in a vacuum oven at 50° C. for 24 hours. The ratio of the respective monomer units in the copolymer of the above structure can be controlled by controlling an initial feed ratio of two monomers used as synthesis materials.

As a result of synthesizing the copolymer of the above structure by the described method, a 78% yield was obtained.

EXAMPLE 5

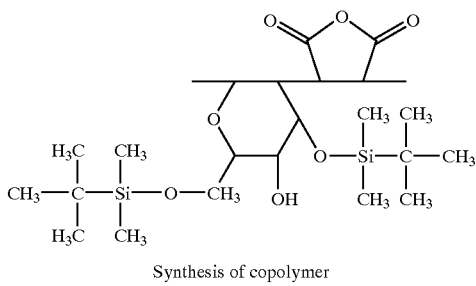

Synthesis of copolymer 9.8 g maleic anhydride (0.1 mol) and 37.5 g 3,6-di-O-(t-butylmethylsilyl)-D-galactal (0.1 mol) are dissolved in THF, benzene, dioxane, or ethyl acetate of 0.1~3 times on the basis of the weight of the whole monomers. Next, a polymerization initiator, AIBN or V601 of 0.1~20 mol % on the basis of the number of moles of the whole monomers is added to the solution. Dissolved oxygen is extracted from the obtained solution by degassing, and purged using nitrogen. The obtained solution is polymerized at 50~90° C. for 2~48 hours, diluted with THF, and precipitated with excess isopropyl alcohol, ether, hexane, or a mixture thereof. The precipitate is dissolved in THF again, and precipitated with isopropyl alcohol, ether, hexane, or a mixture thereof twice. The obtained precipitate is filtered, and dried in a vacuum oven at 50° C. for 24 hours. The ratio of the respective monomer units in the copolymer of the above structure can be controlled by controlling an initial feed ratio of two monomers used as synthesis materials.

As a result of synthesizing the copolymer of the above structure by the described method, a 74% yield was obtained.

EXAMPLE 6

Preparation of Resist Composition and Lithographic Performance

A resist composition is prepared by completely dissolving 1.0 g of copolymer synthesized in Example 1, 0.01 g of triphenylsulfonium trifluoromethane sulfonate (triflate) as a PAG and 2 mg of triisobutylamine as an organic base in 10.0 g of propylene glycol monomethyl ether acetate (PGMEA) and then filtering using a 0.2 μm membrane filter. An i-line resist composition is coated on a silicon (Si) wafer treated by organic anti-reflective coating (ARC) to a thickness of about 1 μm, hard-baked at approximately 200° C. for 90 seconds for complete crosslinking, and then the prepared resist composition is coated thereon to thickness of about 0.2 μm.

Thereafter, the resultant wafer coated with the resist composition is subject to soft baking at approximately 120° C. for 90 seconds and exposed to light using an ArF excimer laser having a numerical aperture (NA) of 0.6. Then, post exposure baking (PEB) is performed at a temperature of 120° C. for 60 seconds.

The resultant is developed using 2.38 wt % of a tetramethylammonium hydroxide (TMAH) solution for about 60 seconds. This resulted in resolution of a 0.15 μm line-and-space pattern at an exposure dose of about 5 mJ/cm².

The obtained resist pattern was used to pattern the underlying i-line resist film using $O_2$-reactive ion etch (RIE) to form a desired pattern.

EXAMPLE 7

Preparation of Resist Composition and Lithographic Performance

A resist composition is prepared by completely dissolving 1.0 g of copolymer synthesized in Example 1, 0.015 g of triphenylsulfonium perfluorobuthane sulfonate as a PAG and 2 mg of triisobutylamine as an organic base in 10.0 g of cyclohexanone. A lithographic performance of the resist composition is evaluated in the same manner as in Example 6. This resulted in resolution of a 0.15 μm line-and-space pattern at an exposure dose of about 3.5 mJ/cm².

The obtained resist pattern was used to pattern the underlying i-line resist film using $O_2$-reactive ion etch (RIE) to form a desired pattern.

EXAMPLE 8

Preparation of Resist Composition and Lithographic Performance

A resist composition is prepared by completely dissolving 1.0 g of copolymer synthesized in Example 2, 0.015 g of triphenylsulfonium perfluorobuthane sulfonate as a PAG and 1.8 mg of N-allylcaprolactam as an organic base in PGMEA. A lithographic performance of the resist composition is evaluated in the same manner as in Example 6. This resulted in resolution of a 0.15 μm line-and-space pattern at an exposure dose of about 5 mJ/cm².

The obtained resist pattern was used to pattern the underlying i-line resist film using $O_2$-reactive ion etch (RIE) to form a desired pattern.

EXAMPLE 9

Preparation of Resist Composition and Lithographic Performance

A resist composition is prepared by completely dissolving 1.0 g of copolymer synthesized in Example 3, 0.015 g of triphenylsulfonium perfluorobuthane sulfonate as a PAG and 1.8 mg of N-allylcaprolactam as an organic base in PGMEA. A lithographic performance of the resist composition is evaluated in the same manner as in Example 6. This resulted in resolution of a 0.15 μm line-and-space pattern at an exposure dose of about 5 mJ/cm².

The obtained resist pattern was used to pattern the underlying i-line resist film using $O_2$-reactive ion etch (RIE) to form a desired pattern.

EXAMPLE 10

Preparation of Resist Composition and Lithographic Performance

A resist composition is prepared by completely dissolving 1.0 g of copolymer synthesized in Example 4, 0.015 g of triphenylsulfonium perfluorobuthane sulfonate as a PAG and 1.8 mg of N-allylcaprolactam as an organic base in PGMEA. A lithographic performance of the resist composition is evaluated in the same manner as in Example 6. This resulted in resolution of a 0.15 μm line-and-space pattern at an exposure dose of about 5 mJ/cm².

The obtained resist pattern was used to pattern the underlying i-line resist film using $O_2$-reactive ion etch (RIE) to form a desired pattern.

EXAMPLE 11

Preparation of Resist Composition and Lithographic Performance

A resist composition is prepared by completely dissolving 1.0 g of copolymer synthesized in Example 5, 0.015 g of triphenylsulfonium perfluorobuthane sulfonate as a PAG and 1.8 mg of N-allylcaprolactam as an organic base in PGMEA. A lithographic performance of the resist composition is evaluated in the same manner as in Example 6. This resulted in resolution of a 0.15 μm line-and-space pattern at an exposure dose of about 5 mJ/cm².

The obtained resist pattern was used to pattern the underlying i-line resist film using $O_2$-reactive ion etch (RIE) to form a desired pattern.

The photosensitive polymer according to the present invention includes a copolymer of an alkyl vinyl ether containing silicon in its protecting group and maleic anhydride. When patterns are formed using a resist composition having the photosensitive polymer, the protecting group is decomposed by acid produced by far ultraviolet rays such as KrF or ArF excimer lasers, and by PEB. Therefore, the content of Si becomes different in an exposure portion and a non-exposure portion, and at the same time, solubility to an alkali solvent becomes different. After the latent image is etched using $O_2$-RIE, or the latent image is developed with an alkali solution, and patterned, the underlying layer can be etched using $O_2$-RIE. Here, an oxide layer is formed of $SiO_x$ in the non-exposure portion where Si exists among the resist layers during dry etching, and such an oxide layer does not exist in the exposure portion. Therefore, the underlying layer can be patterned using a difference of selectivity to $O_2$-RIE in the non-exposure portion and the exposure portion.

Also, since the photosensitive polymer according to the present invention includes a copolymer of an alkyl vinyl ether and maleic anhydride, it has super adhesive property to underlying layers. In particular, since the size of a portion acting as an adhesion promoter within a polymer is relatively very small, a portion of Si in the whole structure of the polymer becomes relatively larger. Therefore, superior etching selectivity can be provided compared to conventional materials. Also, maleic anhydride and ring-type vinyl ether containing Si are both commercially available at a low price. Therefore, the photosensitive polymer according to the present invention can be inexpensively manufactured, and the resist composition can provide sufficient resistance to dry etching, and can secure favorable thermal stability and wettability to a developing solution.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A photosensitive polymer comprising a copolymer of alkyl vinyl ether and maleic anhydride, represented by the following formula:

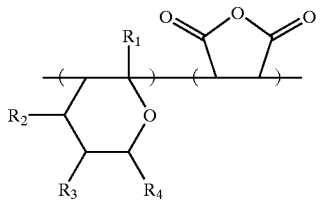

where
- $R_1$ is —H, —OSi(CH$_3$)$_2$C(CH$_3$)$_3$ or —OSi(CH$_3$)$_3$,
- $R_2$ is —H, —OH, —OCOCH$_3$, —OSi(CH$_3$)$_2$C(CH$_3$)$_3$ or —OSi(CH(CH$_3$)$_2$)$_3$,
- $R_3$ is —H, —OH or —OCOCH$_3$,
- $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and
- at least one of $R_1$, $R_2$ and $R_4$ is a Si-containing group.

2. A resist composition comprising:
- a photoacid generator (PAG); and
- a photosensitive polymer comprising a copolymer of alkyl vinyl ether and maleic anhydride, represented by the following formula:

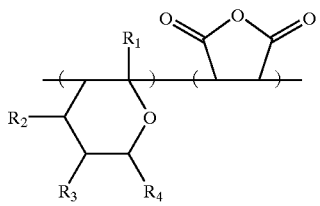

where
- $R_1$ is —H, —OSi(CH$_3$)$_2$C(CH$_3$)$_3$ or —OSi(CH$_3$)$_3$,
- $R_2$ is —H, —OH, —OCOCH$_3$, —OSi(CH$_3$)$_2$C(CH$_3$)$_3$ or —OSi(CH(CH$_3$)$_2$)$_3$,
- $R_3$ is —H, —OH or —OCOCH$_3$,
- $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and
- at least one of $R_1$, $R_2$ and $R_4$ is a Si-containing group.

3. The resist composition according to claim 2, wherein the weight average molecular weight of the photosensitive polymer is 1,000~100,000.

4. The resist composition according to claim 2, wherein the amount of the PAG is 1~30 wt % on the basis of the weight of the photosensitive polymer.

5. The resist composition of claim 2, wherein the PAG comprises triarylsulfonium salts, diaryliodonium salts, sulfonates, or mixtures thereof.

6. The resist composition of claim 2, wherein the PAG comprises triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyidiphenyliodonium nonaflate, N-hydroxysuccinimide nonaflate, norbornene-dicarboximide-nonaflate, triphenylsulfonium PFOS (perfluorooctanesulfonate), diphenyliodonium PFOS, methoxydiphenyliodonium PFOS, di-t-butyldiphenyliodonium triflate, N-hydroxysuccinimide PFOS, norbornene-dicarboximide PFOS, or mixtures thereof.

7. The resist composition of claim 2, further comprising an organic base.

8. The resist composition of claim 7, wherein the amount of the organic base is 0.01~2.0 wt % on the basis of the weight of the photosensitive polymer.

9. The resist composition of claim 7, wherein the organic base comprises a tertiary amine compound alone or a mixture of at least two tertiary amine compounds.

10. The resist composition of claim 7, wherein the organic base comprises triethylamine, triisobutylamine, triisooctylamine, triisodecylamine, diethanolamine, triethanolamine, N-alkyl substituted pyrrolidinone, N-alkyl substituted caprolactam, N-alkyl substituted valerolactam, or a mixture thereof.

11. The resist composition of claim 2, further comprising a surfactant of 30 to 200 ppm.

12. A resist composition comprising:
- a photoacid generator (PAG); and
- a photosensitive polymer comprising a polymer of alkyl vinyl ether, represented by the following formula:

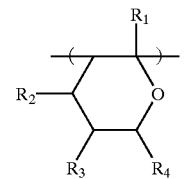

where
- $R_1$ is —H, —OSi(CH$_3$)$_2$C(CH$_3$)$_3$ or —OSi(CH$_3$)$_3$,
- $R_2$ is —H, —OH, —OCOCH$_3$, —OSi(CH$_3$)$_2$C(CH$_3$)$_3$ or —OSi(CH(CH$_3$)$_2$)$_3$,
- $R_3$ is —H, —OH or —OCOCH$_3$,
- $R_4$ is —H, —OSi(CH$_3$)$_2$C(CH$_3$)$_3$, —CH$_2$OSi(CH$_3$)$_2$C(CH$_3$)$_3$ or —CH$_2$OSi(CH(CH$_3$)$_2$)$_3$ and
- at least one of $R_1$, $R_2$ and $R_4$ is a Si-containing group.

13. The resist composition according to claim 12, wherein the weight average molecular weight of the photosensitive polymer is 1,000~100,000.

14. The resist composition according to claim 12, wherein the amount of the PAG is 1~30 wt % on the basis of the weight of the photosensitive polymer.

15. The resist composition of claim 12, wherein the PAG comprises triarylsulfonium salts, diaryliodonium salts, sulfonates, or mixtures thereof.

16. The resist composition of claim 12, wherein the PAG comprises triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyidiphenyliodonium nonaflate, N-hydroxysuccinimide nonaflate, norbornene-dicarboximide-nonaflate, triphenylsulfonium PFOS (perfluorooctanesulfonate), diphenyliodonium PFOS, methoxydiphenyliodonium PFOS, di-t-butyidiphenyliodonium triflate, N-hydroxysuccinimide PFOS, norbornene-dicarboximide PFOS, or mixtures thereof.

17. The resist composition of claim 12, further comprising an organic base.

18. The resist composition of claim 17, wherein the amount of the organic base is 0.01~2.0 wt % on the basis of the weight of the photosensitive polymer.

19. The resist composition of claim 17, wherein the organic base comprises a tertiary amine compound alone or a mixture of at least two tertiary amine compounds.

20. The resist composition of claim 17, wherein the organic base comprises triethylamine, triisobutylamine, triiooctylamine, triisodecylamine, diethanolamine, triethanolamine, N-alkyl substituted pyrrolidinone, N-alkyl substituted caprolactam, N-alkyl substituted valerolactam, or a mixture thereof.

21. The resist composition of claim 12, further comprising a surfactant of 30 to 200 ppm.

* * * * *